United States Patent [19]
Pei et al.

[11] Patent Number: 6,083,028
[45] Date of Patent: Jul. 4, 2000

[54] ZIF PGA SOCKET

[75] Inventors: Wen-Chun Pei; Ming-Lun Szu, both of Taipei, Taiwan

[73] Assignee: Hon Hai Precision Ind. Co., Ltd., Taipei Hsien, Taiwan

[21] Appl. No.: 09/167,798

[22] Filed: Oct. 7, 1998

[51] Int. Cl.[7] ...................................................... H01R 4/50
[52] U.S. Cl. .......................................................... 439/342
[58] Field of Search ................................... 439/342, 259, 439/266, 269.1, 73, 263, 264

[56] References Cited

U.S. PATENT DOCUMENTS 5,493,150  2/1996  Matsuoka et al. ....................... 257/668
5,855,489  1/1999  Walker ..................................... 439/342

*Primary Examiner*—Neil Abrams
*Assistant Examiner*—Eugene G. Byrd

[57] ABSTRACT

A ZIF PGA socket includes a cover slidably engaged with a base to which a cam is pivotably connected. The cam is selectively rotated in clockwise or counterclockwise directions thereby driving the cover to move laterally in opposite directions with respect to the base. The rotation of the cam is retained in a constant plane which is substantially parallel to the movement plane of the cover. The cam and the cover is so configured that free-wheeling will not occur when the cam changes from one orientation to an opposite orientation.

18 Claims, 12 Drawing Sheets

ZIF PGA SOCKET

BACKGROUND OF THE INVENTION

1. Field of the Invention

The present invention relates to a socket for a CPU, especially a ZIF PGA socket including a new actuation structure by which the ZIF PGA socket is operative between a loosened status and a tightened status for receiving and securing pins of the CPU in position during insertion of the CPU into the socket.

2. The Prior Art

Conventional ZIF PGA connectors are usually installed with an actuation mechanism for controlling insertion/withdrawal of a CPU chip. Normally, this actuation mechanism is controlled by a handle which operates in a vertical manner for positioning the socket between a loosened status and a tightened status. In the loosened status the socket is ready to receive or withdraw the CPU with minimum friction. In the tightened status, the socket firmly secures pins of the CPU therein. The vertical operation of the handle of the actuation mechanism may interfere with nearby components. To eliminate this problem, the handle portion of the actuation mechanism can be replaced by an external handle tool such as a screw driver.

FIGS. 18 and 19 illustrate a conventional ZIF PGA socket having a cover 100 defining a plurality of first passageways 146 therethrough and a first opening 110 in a first edge thereof. A base 300 is adapted to be slidably attached to the cover 100. The base 300 includes a plurality of second passageways 310 in alignment with the corresponding first passageways 146. Each second passageway 310 receives a contact for electrical and mechanical engagement with a pin of a corresponding component. The base 300 also defines a second opening 340 at an edge thereof substantially communicating with the first opening 110 of the cover 100. The cover 100 comprises two side walls 130 extending downward from two sides thereof. Each side wall defines two recesses 135 in an interior surface thereof. The base 300 forms two protrusions 320 on opposite side walls thereof for slidable reception in the corresponding recesses 135 of each side wall 130 of the cover 100. A first slot 120 is formed in an underface of the cover 100 in communication with the first opening 110. A second slot 330 is formed in the base 300 in communication with the second opening 340.

An actuation device 200 is rotatably received between the first slot 120 of the cover 100 and the second slot 330 of the base 300, and includes a center rotation section 210. Two cam sections 220 are connected to opposite ends of the center rotation section 210. An engagement slot 215 is defined in the center rotation section 210 of the actuation device 200 for reception of an external tool (not shown) and actuation thereby within a ninety degree range for displacing the cover 100 via the two cam sections 230 in a horizontal direction with regard to the base 300. The actuation device 200 further comprises two end rotation sections 230 connected to the corresponding cam sections 220 for facilitating rotation of the actuation device upon operation of the external tool.

Although this conventional socket has addressed the inconvenience mentioned above, the structure thereof is too complicated and occupies too much space, particularly the height thereof, thus violating the trend of the computer industry toward compactness. Hence, it is requisite to provide a new structure for a CPU socket.

SUMMARY OF THE INVENTION

The primary purpose of the present invention is to provide an improved ZIF PGA socket having a compact dimension especially regarding the height thereof.

The second purpose of the present invention is to provide an improved ZIF PGA socket having a simple structure.

The third purpose of the present invention is to provide an improved ZIF PGA socket which is easy to operate.

The fourth purpose of the present invention is to provide an improved ZIF PGA socket which can move a cover thereof in opposite direction by different rotational directions and also prevent free-wheeling effect during change of rotational direction thereof.

To fulfill the above purposes, a ZIF PGA socket in accordance with a first embodiment of the present invention comprises a ZIF PGA socket comprising a longitudinal base defining a recess exposed to an exterior thereof, a cover slidably engaging with the base, and an actuation device comprising a cam pivotably received in the recess of the base for actuating the cover to move laterally with respect to the base. The cover has a first stop and a second stop projecting downward therefrom. The cam has a first driving member and a second driving member projecting therefrom and a handle portion extending into the exterior of the base and the cover. The first driving member and the second driving member are located in opposite arc portions of a virtual circle and cooperate to selectively and respectively drive either the first stop or the second stop to force the cover to move laterally with respect to the base when the handle is operated causing rotation of the cam with respect to the base. A rotational plane of the cam is substantially parallel to a plane of movement of the cover. The first driving member and the second driving member are curved tabs which are at all time respectively in contact with the first stop and the second stop for preventing free-wheeling when the handle is operated from a first orientation to an opposite orientation.

To fulfill the above purposes, a ZIF PGA socket in accordance with a second embodiment of the present invention comprises a longitudinal base, a cover slidably engaging with the base, and an actuation device pivotably fixed to the base for actuating the cover to move laterally with respect to the base. The base defines a first pivot member for pivotably engaging with the actuation device. The cover has a first stop and a second stop. The actuation device having a cam and a handle portion extending from the cam, a second pivot member formed in the cam for pivotably engaging with the first pivot member, first driving means and second driving means projecting therefrom and aligned with each other in a line nearly perpendicular to a lengthwise axis defined from a free end of the handle portion to the second pivot member, the first driving means and the second driving means cooperating to selectively and respectively contact and drive either the first stop or the second stop to force the cover to move laterally with respect to the base when the cam is operated to rotate about the first pivot member of the base.

DETAILED DESCRIPTION OF THE PREFERRED EMBODIMENTS

Figure 1:
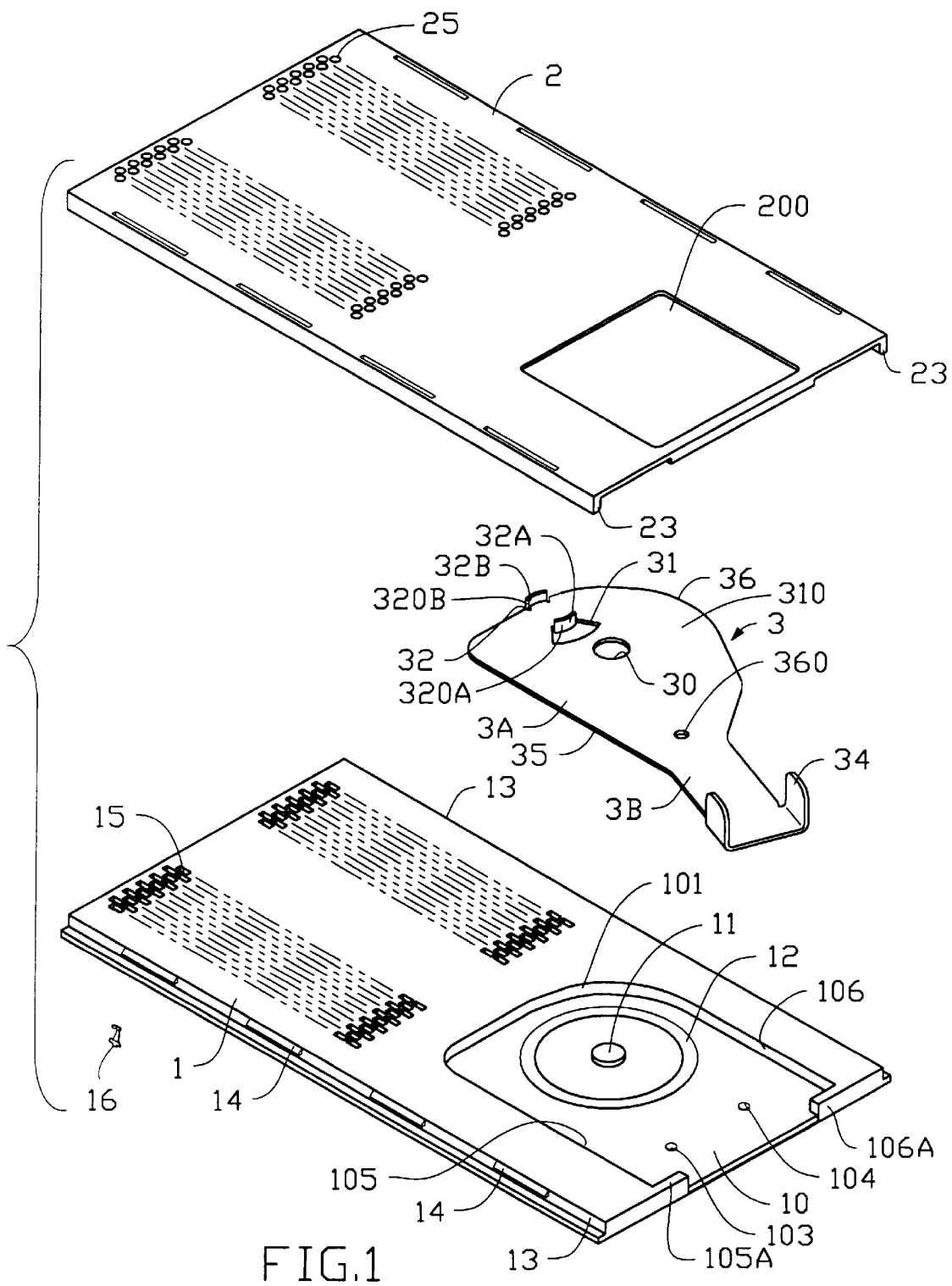
FIG. 1 is an exploded view of a ZIF PGA socket in accordance with a first embodiment of the present invention.

Referring to FIG. 1, a ZIF PGA socket in accordance with a first embodiment of the present invention comprises a longitudinal base 1, a cover 2 slidably engaging with the base 1, and an actuation device 3 pivotably fixed to the base 1. The base 1 defines a substantially U-shaped recess 10 bound by an inner wall 101, and upper and lower side walls 105, 106 and exposed to a side of the base 1. A pivot 11 projects from a bottom surface of the recess 10 and a circular protrusion 12 is formed around the pivot 11, wherein the pivot 11 extends beyond the circular protrusion 12. A plurality of first passageways 15 are defined in the base 1 for receiving contacts 16 therein. The base 1 has two longitudinal parallel side walls 13 on which a plurality of engaging protrusions 14 are formed. A first positioning protrusion 103 and a second positioning protrusion 104 project from the bottom surface of the recess 10 for limiting the rotation of the cam portion 3A a predetermined angular range, such as 40 degrees, with respect to the pivot 11. Two flanges 105A, 106A respectively extend from the side walls 105, 106 also for limiting the rotational range of the cam portion 3A.

Figure 2:
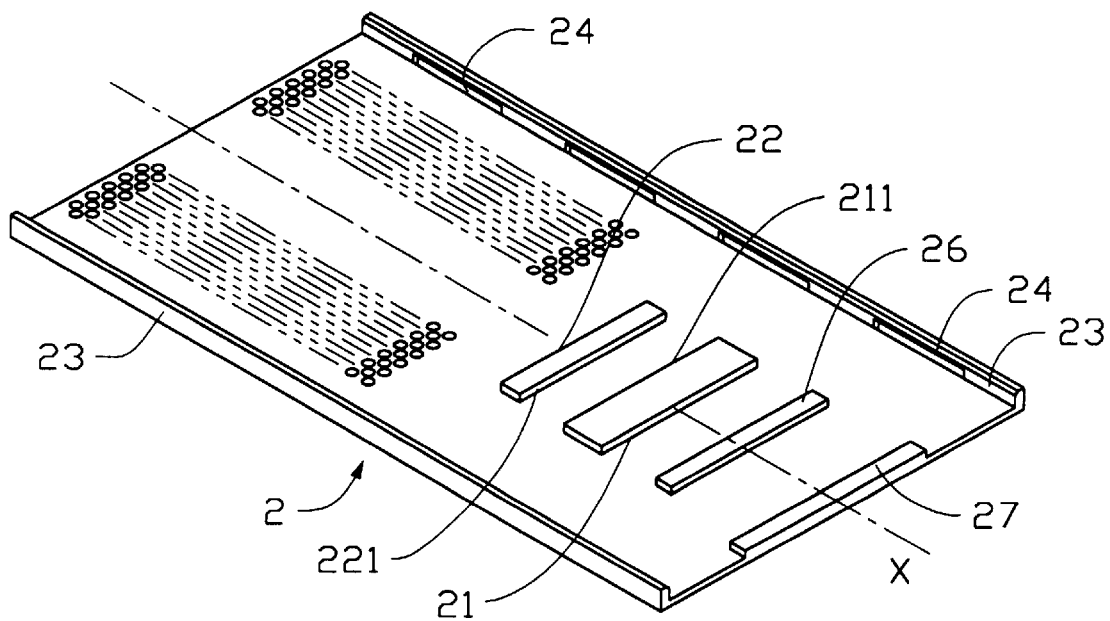
FIG. 2 is a bottom view of a cover of the ZIF PGA socket of FIG. 1.

Referring to FIG. 2, the cover 2 has a first stop 21 and a second stop 22 projecting from an inner surface thereof, each having a contacting side wall 211, 221 substantially parallel to and spaced from each other a predetermined distance. Two limiting protrusions 26, 27 project from the same surface and are substantially parallel to the two stops 21, 22. A normal line perpendicular to both parallel sides of the two stops 21, 22 is defined as an axis of movement X for the cover 2 with respect to the base 1. The axis X is parallel to the longitudinal side walls 13 of the base 1. Two flanges 23 extend downward from longitudinal sides of the cover 2 for slidably engaging with the longitudinal side walls 13 of the base 1. A plurality of recesses 24 are defined in an inner wall of each flange 23 for loosely retaining the engaging protrusions 14 of the base 1 therein. A plurality of second passageways 25 are defined in the cover 2 to be aligned with the first passageways 15 of the base 1 when the cover 2 is slidably engaged with the base 1. After the insertion of pins of a CPU chip (not shown) into the first and second passageways 15, 25, the pins will be driven by periphery of the second passageways 25 of the cover 2 to firmly engage with the contacts 16 of the base 1 when the cover 2 is driven by the actuation device 3 to have a relative displacement with respect to the base 1. The cover 2 also defines an upper recess 200 in a top surface thereof for accommodating a portion of the CPU module such as a Pentium™ II module.

Figure 3A:
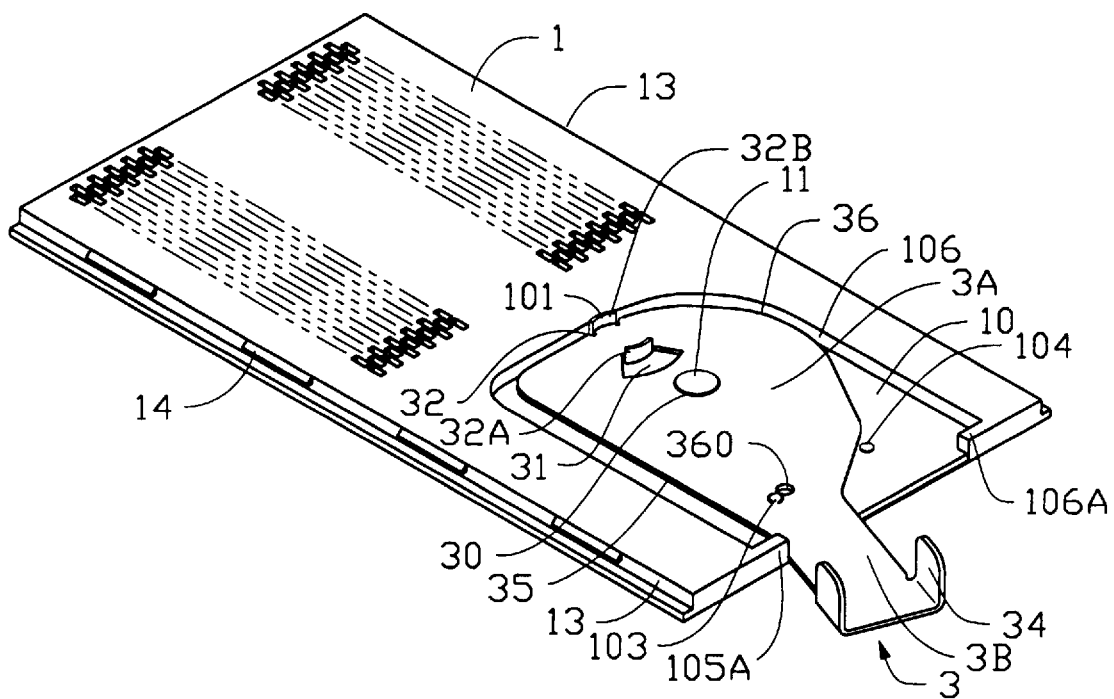
FIG. 3A is a perspective view of an actuation device fixed to a base of the ZIF PGA socket of FIG. 1.

Further referring to FIG. 1 together with FIG. 3A, the actuation device 3 is a metal plate which has a cam portion 3A defining a hole 30 pivotably engaging with the pivot 11 of the base 1, and a handle portion 3B extending from the cam portion 3A and comprising two ears 34 extending upward from two side end portions thereof for facilitating operation by a user. The cam portion 3A has upper and lower longitudinal sides 35, 36 bound by the side walls 105, 106 of the recess 10 when the actuation device 3 is fixed to the pivot 11. A virtual driving line L is defined between the hole 30 and a center point (not labeled) at one free end of the handle portion 3B. A first driving tab 32A and a second driving tab 32B upwardly beyond a surface 310 of project the cam portion 3A to respectively form a first acting surface 320A and a second acting surface 320B substantially along opposite arcs of a virtual circle and both tabs 32A, 32B are located in a same side with respect to the driving line L. The first tab 32A is formed on an inner portion of the cam portion 3A while the second tab 32B is formed on an edge thereof. The tabs 32A, 32B may be formed by stamping thus respectively defining openings 31, 32 simultaneously. A length between a free end of the handle portion 3B and the hole 30 is significantly greater than the distance between the second driving tab 32B and the hole 30; therefore, the operation of the handle portion 3B is force conservative. A positioning hole 360 is defined substantially between the cam portion 3A and the handle portion 3B for loosely receiving one of the two positioning protrusions 103, 104 when the cam portion 3A is rotated to an angular limit with respect to the pivot 11.

Figure 4:
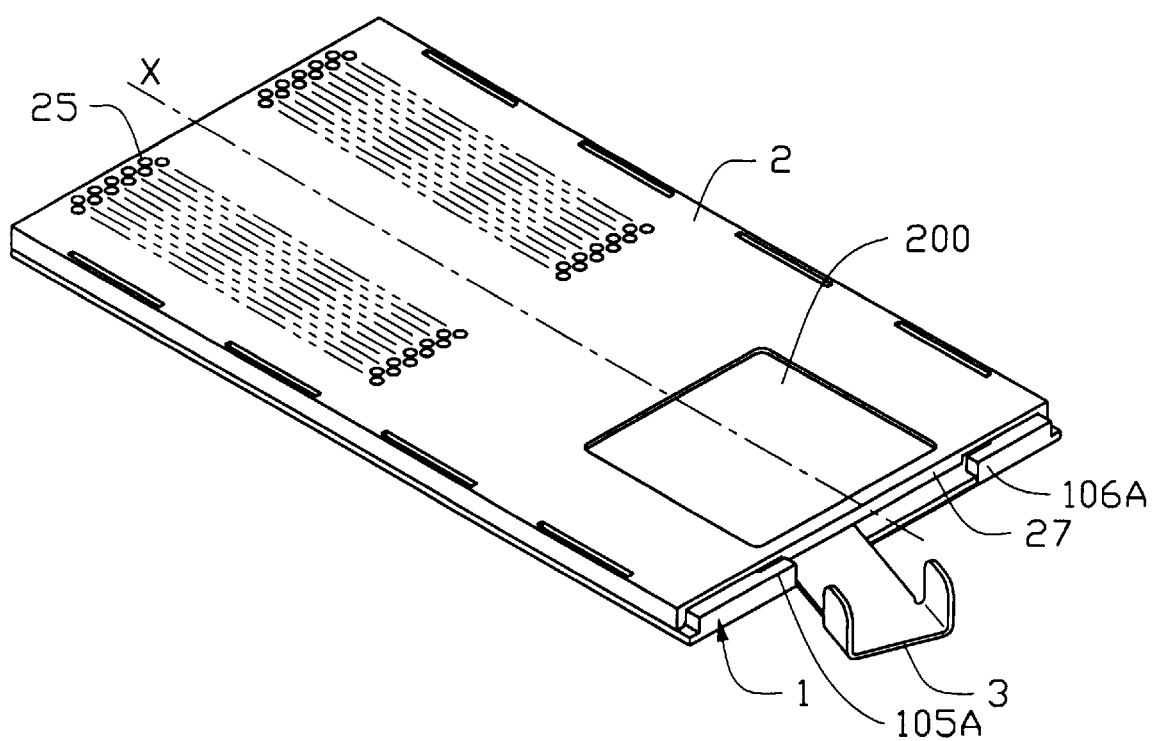
FIG. 4 is an assembled view of FIG. 1.

In assembly, the cover 2 is slidably engaged with the base 1, wherein the flanges 23 thereof loosely clip the two side walls 13 of the base 1, the recesses 24 of each flange 23 loosely retain the engaging protrusions 14 of the corresponding side wall 13 of the base 1, the first and second tabs 32A, 32B of the cam portion 3A are positioned between the first and second stops 21, 22 of the cover 2, and each first passageway 15 of the base 1 communicates with the corresponding second passageway 25 of the cover 2, as seen in FIG. 4. The limiting protrusions 26 and 27 (also see FIG. 2) are proximate the actuation device 3 for limiting rotation thereof in a constant plane.

Referring back to FIG. 3A, when the handle portion 34 of the actuation device 3 is manually operated, the cam portion 3A will be pivotably moved about the pivot 11 of the base 1 within a predetermined angular range substantially equal to forty degrees thereby causing the tabs 32A, 32B to laterally drive either the first stop 21 or the second stop 22 in opposite directions along the axis of movement X during different time periods.

The relative orientation between the tabs 32A, 32B and the stops 21, 22 of the socket during operation may be separated into six status's as explained hereunder.

Figure 5:
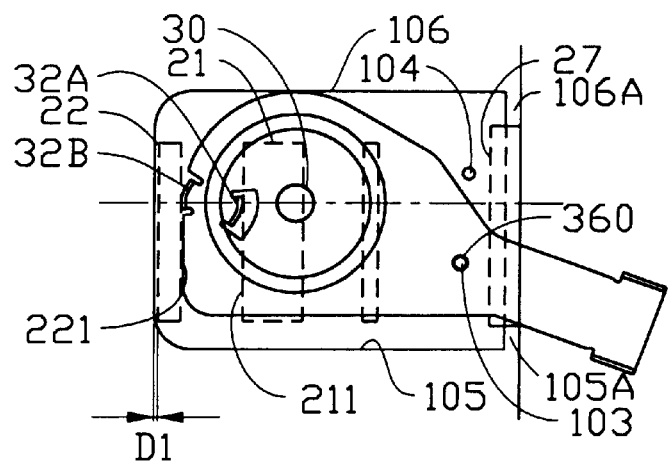
FIGS. 5 to 10 show different spatial relationships between two tabs of the actuation device and two stops of the cover when the cover is driven to move with respect to the base.

Referring to FIG. 5, the socket is at a first status (most-loosened status), wherein insertion/withdrawal of pins of the CPU is met with minimum resistance (zero insertion force). In the first embodiment, variation of a lateral distance D1 between an inner wall 101 of the recess 10 and the second stop 22 can be interpreted as the moving distance of the cover 2 with respect to the base 1. At this position, the lower side 35 of the cam portion 3A is substantially parallel to the side wall 105 of the recess 10 (a 0-degree angle therebetween), the handle portion 3B encounters the flange 105A, and the positioning hole 360 thereof loosely retains the first positioning protrusion 103 therein. At this status, the cam portion 3A is at an extreme position. The first tab 32A and the second tab 32B of the cam portion 3A contact the first and second stops 21, 22, respectively.

Figure 6:
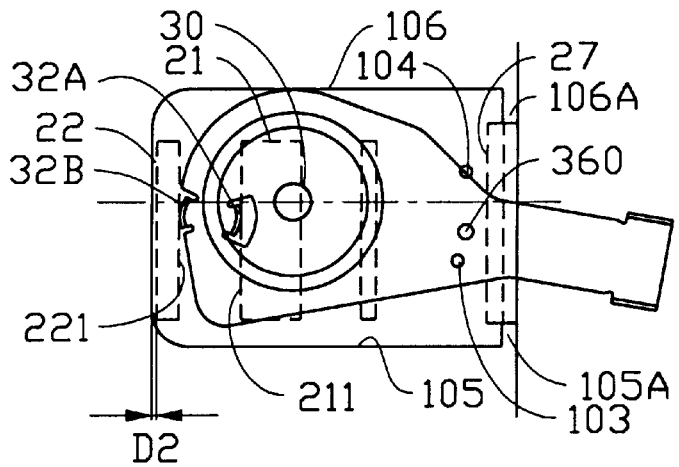

Referring to FIG. 6, the socket is at a second status, wherein the cam portion 3A is rotated counterclockwise about the pivot 11 at a predetermined angle, therefore the first and second tabs 32A and 32B are also rotated counterclockwise with respect to the pivot 11. The second tab 32B keeps in loose contact with the second stop 22 while the first tab 32A moves along the contacting side wall 211 of the first stop 21 and forces the cover 2 to move laterally along a positive X direction with respect to the base 1. The distance between the second stop 22 and the inner wall 101 of the recess 10 is increased from D1 (FIG. 5) to D2. The distance of movement of the cover 2 from the first status to the second status is (D2–D1). The first tab 32A of the cam portion 3A and the first stop 21 continually change contacting points therebetween thus preventing wear thereof.

Figure 7:
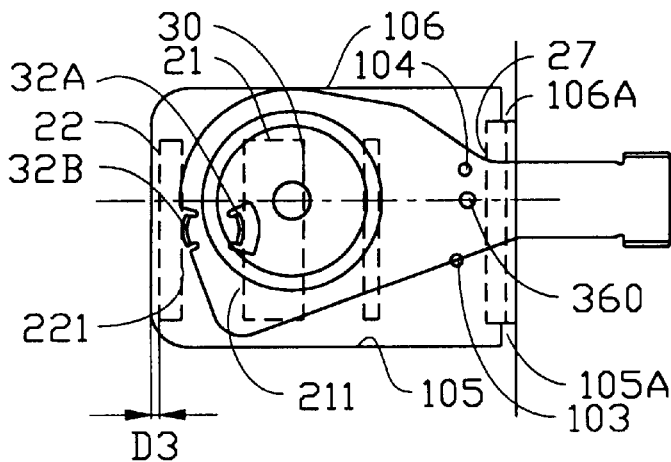

Referring to FIG. 7, the socket is in a third status, wherein the cam portion 3A is further rotated counterclockwise a predetermined degree about the pivot 11. The second tab 32B keeps in loose contact with the second stop 22, and the first tab 32A continues to move along the contacting surface 211 of the first stop 21 and forces the cover 2 to move laterally along the positive X direction with respect to the base 1. The distance between the second stop 22 and the inner wall 101 of the groove 10 is increased from D2 (FIG. 6) to D3. The moving distance of the cover 2 from the second status to the third status is (D3–D2).

Figure 8:
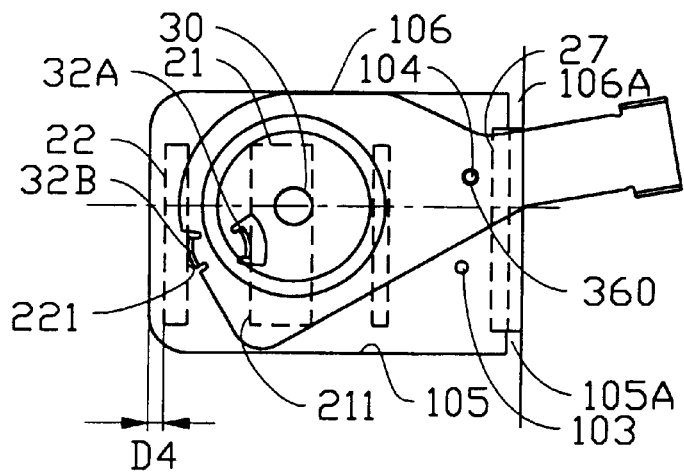

Referring to FIG. 8, the socket is at a fourth status, wherein the cam portion 3A is further rotated counterclockwise about the pivot 11 until the positioning hole 360 of the cam portion 3A loosely retains the second positioning protrusion 104 and the handle portion 3B is stopped by the flange 106A. The socket is at a most-tightened status, whereby pins of the CPU are firmly retained in the passageways 15, 25 of the socket. Meanwhile, the second tab 32B keeps in loose contact with the second stop 22 and the first tab 32A of the cam portion 3A continues to move along the contacting surface 211 of the first stop 21 and forces the cover 2 to move laterally along the positive X direction with respect to the base 1. The distance between the second stop 22 and the inner wall 101 of the recess 10 increases from D3 (FIG. 7) to D4. The moving distance of the cover 2 from the third status to the fourth status is (D4–D3). Therefore, from FIGS. 5 through 8, the socket changes from the most-loosened status to the most-tightened status.

Figure 9:
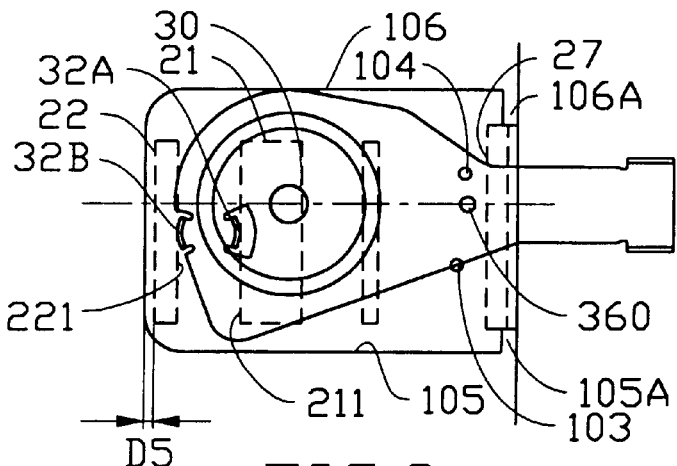

Referring to FIG. 9, the socket is at a fifth status. From the fourth status to the fifth status, the cam portion 3A is rotated clockwise about the pivot 11, the positioning hole 360 of the cam portion 3A separates from the fourth stop 104, the first tab 32A keeps in loose contact with the first stop 21, and the second tab 32B abuts against and moves along the contacting surface 221 of the second stop 22 thereby driving the second stop 22 to move along the negative X direction a distance equaling (D4–D5), wherein D4 is greater than D5 and D5 is the distance between the second stop 22 and the inner wall 101 of the recess 10.

Figure 10:
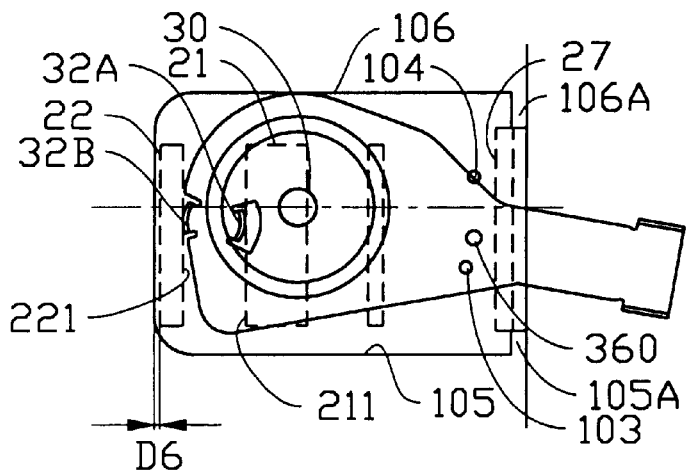

Referring to FIG. 10, the socket is at a sixth status. From the fifth status to the sixth status, the cam portion 3A is rotated clockwise with respect to the pivot 11, the first tab 32A keeps in loose contact with the first stop 21, the second tab 32B continues to move along the contacting surface 221 of the second stop 22 thereby driving the second stop 22 to move along the negative X direction with a distance equaling (D5–D6), wherein D5 is greater than D6 and D6 is the distance between the second stop 22 and the inner wall 101 of the recess 10.

Referring to FIGS. 5 and 10, the cam portion 3A is continuously driven to rotate clockwise until the socket changes from the sixth status to the first status. Specifically, the cam portion 3A is rotated clockwise about the pivot 11, and the second tab 32B continues to move along the contacting surface 221 of the second stop 22 thereby driving the second stop 22 to move along the negative X direction a distance equaling (D6–D1), wherein D6 is greater than D1. Therefore, from FIG. 8 through FIGS. 9 and 10 to FIG. 5, the socket changes from the most-tightened status to the most-loosened status.

From the above description, it can be concluded that the socket experiences six status's in a cycle for moving the cover 2 from a left most position (FIG. 5) to a right most position (FIG. 8) and then back to the left most position (FIG. 5).

Figure 3B:
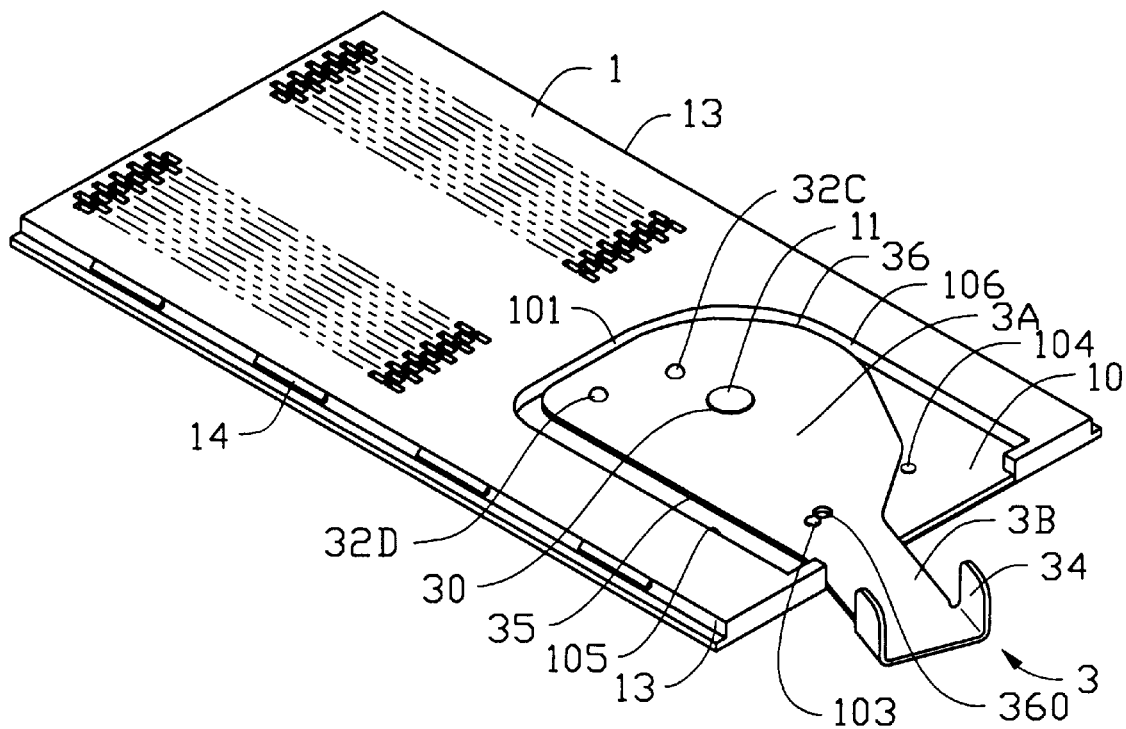
FIG. 3B is a perspective view of a second embodiment of the actuation device fixed to the base of FIG. 3A.
Figure 11:
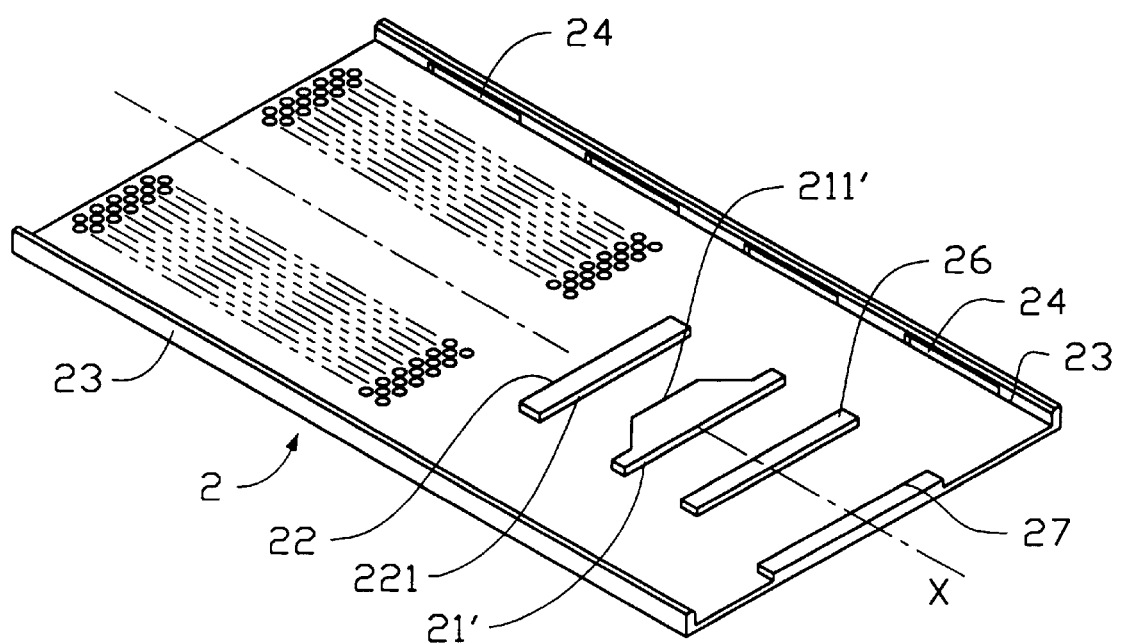
FIG. 11 is a bottom view of a second embodiment of the cover of the ZIF PGA socket.

A second embodiment of the present invention is shown in FIGS. 3B and 11, wherein most components are identical to those of the first and second embodiments except for the first and second tabs 32A and 32B which are respectively replaced with a first driving protrusion 32C and a second driving protrusion 32D and the first stop 21 is changed to a wedge-shaped member 21' having a contacting surface 211'. In the second embodiment, a virtual line defined between the first driving protrusion 32C and the second driving protrusion 32D is nearly perpendicular to the virtual line L (particularly see FIG. 12).

Figure 12:
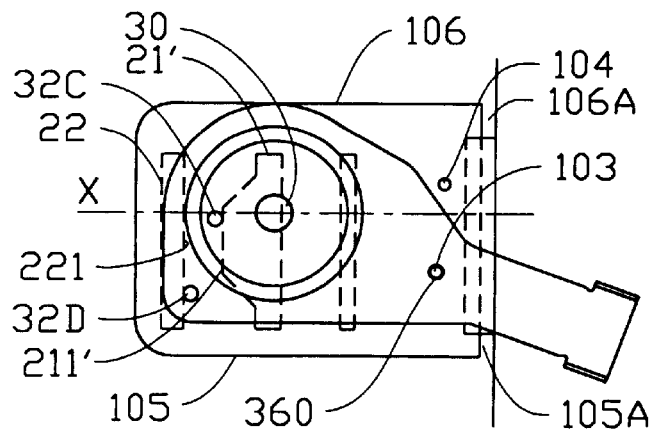
FIGS. 12 to 17 show different spatial relationships between two driving protrusions of the actuation device of FIG. 3B and two stops of the cover of FIG. 11 in accordance with the second embodiment of the present invention.
Figure 13:
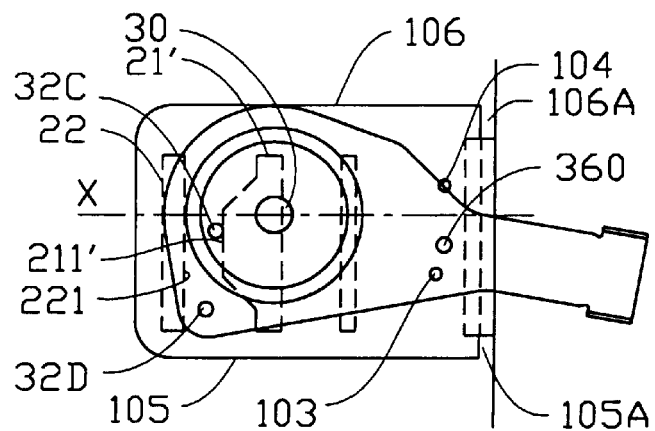
Figure 14:
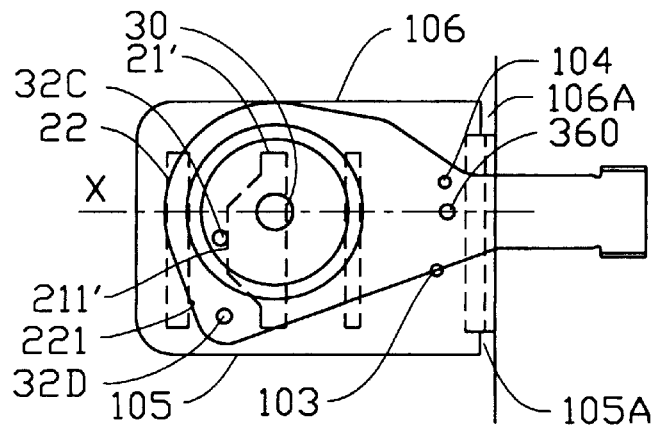
Figure 15:
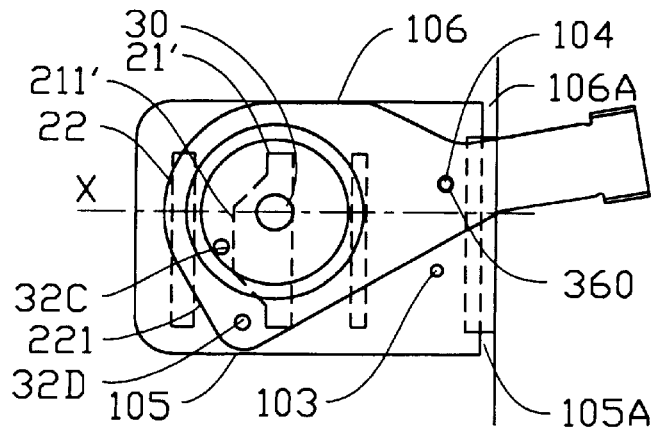
Figure 16:
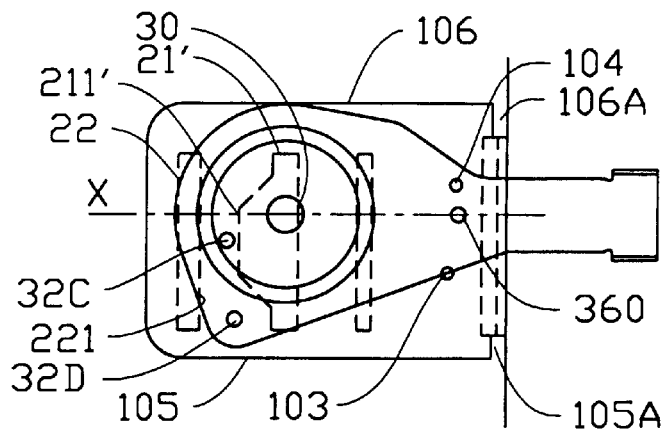
Figure 17:
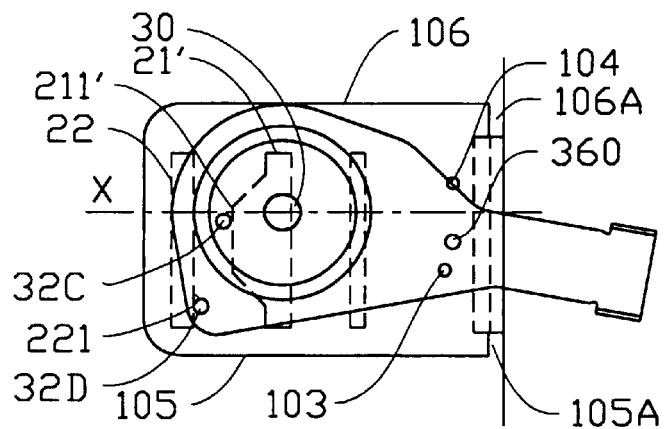
Figure 18:
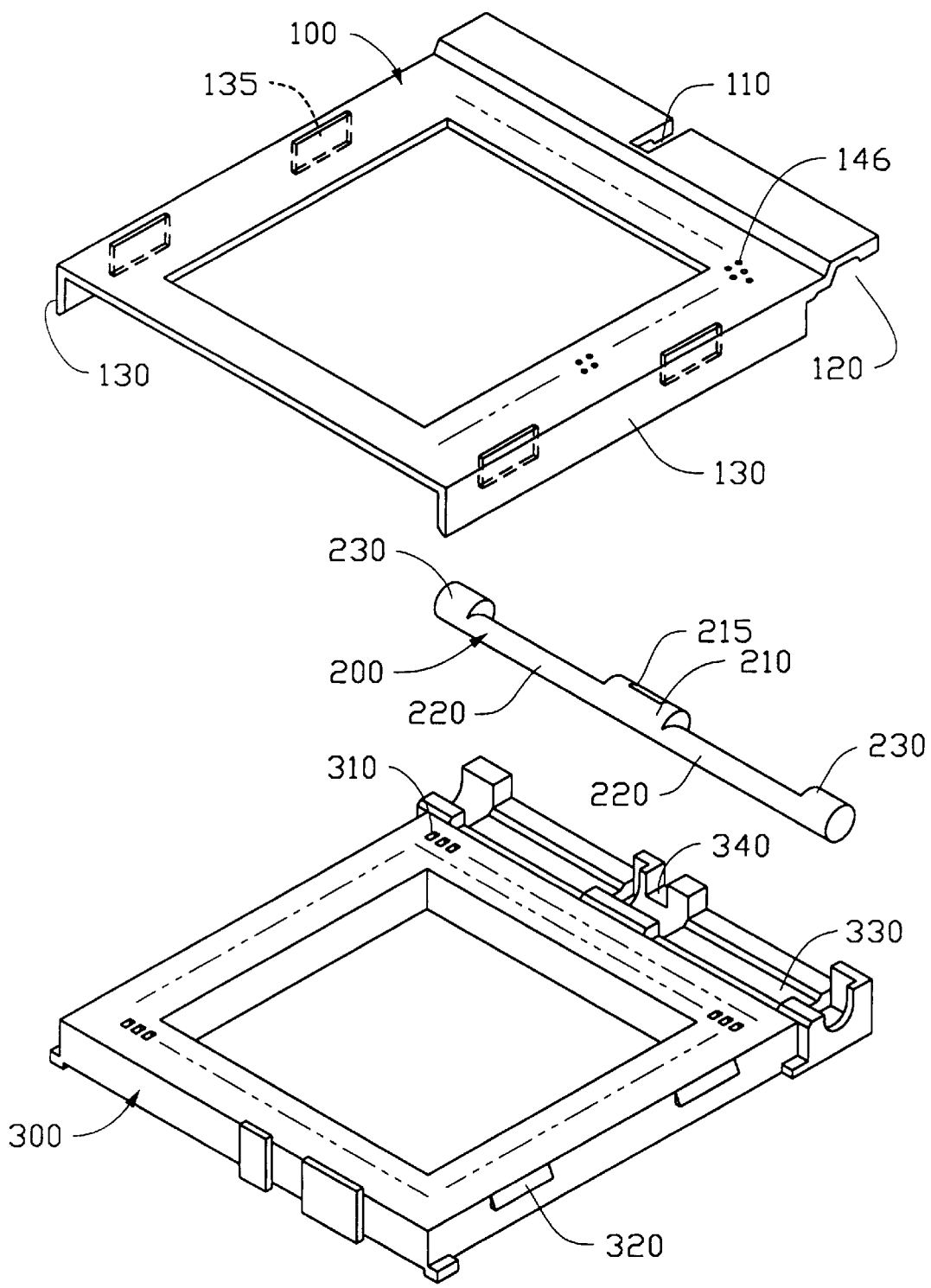
FIG. 18 is an exploded view of a conventional ZIF PGA socket.
Figure 19:
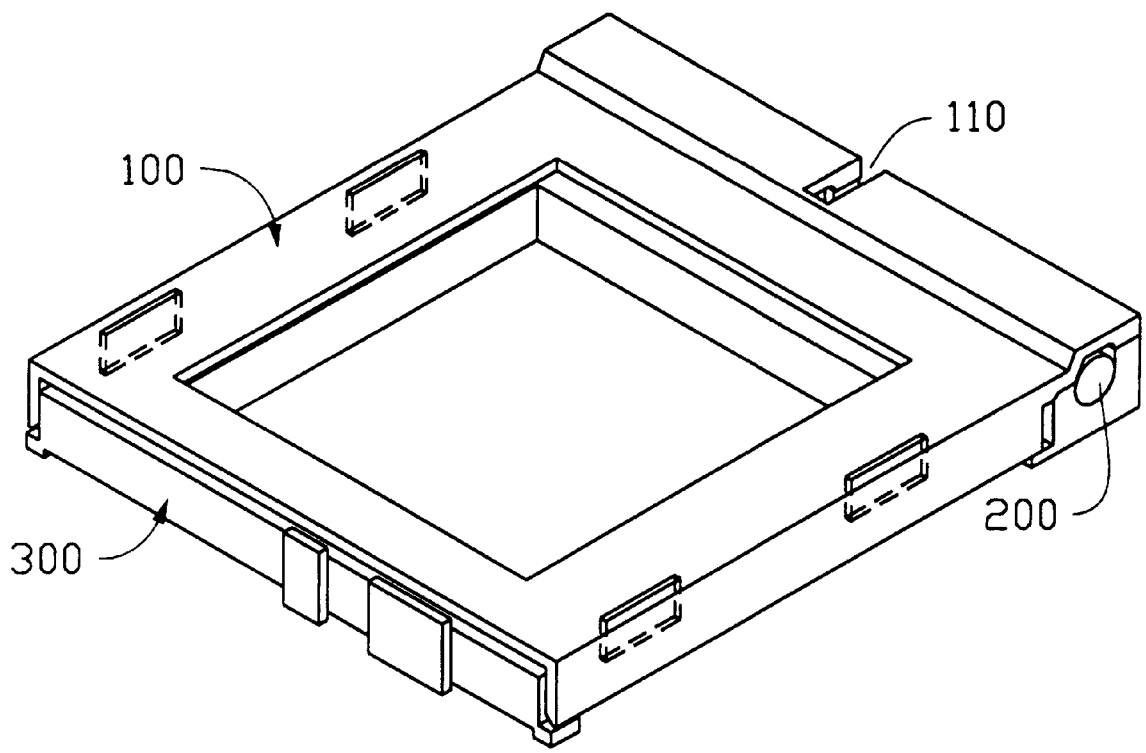
FIG. 19 is an assembled view of FIG. 18.

FIGS. 12 to 17 and back to FIG. 12 illustrate the cyclical operation of the second embodiment from a most-loosened status to a most-tightened status and back to the most-loosened status. Since the operational theory is similar to that of the first embodiment, a detailed description thereof is omitted herein. Briefly, from FIG. 12 to FIG. 15, the first driving protrusion 32C forces the first stop 21' to move laterally in the positive X direction until the positioning hole 360 changes its retention from the first positioning protrusion 103 to the second positioning protrusion 104. During this period, the socket changes from the most-loosened status to the most-tightened status. Similarly, from FIGS. 15 to 17 and back to FIG. 12, the second driving protrusion 32D forces the second stop 22 to move laterally in the negative X direction until the positioning hole 360 changes its retention from the second positioning protrusion 104 to the first positioning protrusion 103. The wedge shape of the first stop 21' is for preventing interference with the second driving protrusion 32D during operation as shown in FIG. 15.

One main feature of the first embodiment of the invention is to have the first driving tab 32A and the second driving tab 32B in constant engagement with the corresponding first stop 21 and second stop 22, respectively, thus assuring instant actuation between the actuation device 3 and the cover 2 without the aforementioned free-wheeling effect of the actuation device 3 occurring. Therefore, such actuation is easily controllably smooth for the user. In the first embodiment, the first driving tab 32A and the second driving tag 32B are two opposite arcs of a virtual circle wherein the diameter of such circle is generally equal to the distance between the first stop 21 and the second stop 22. This structure assures constant engagement between the first driving tab 32A and the first stop 21 or between the second driving tab 32B and the second stop 22 without any interference during either clockwise or counterclockwise rotation of the actuation device 3. Anyhow, it should be understood that the first driving tab 32A and the second driving tab 32B may belong to two concentric circles with two different diameters wherein the sum of the radius of the first tab and that of the second tab is generally equal to the distance between the first stop 21 and the second stop 22. This structure also assures the instant engagement between the driving tabs and the corresponding stops without interference during either clockwise or counterclockwise rotation of the actuation device 3.

While the present invention has been described with reference to specific embodiments, the description is illustrative of the invention and is not to be construed as limiting the invention.

Therefore, various modifications to the present invention can be made to the preferred embodiments by those skilled in the art without departing from the true spirit and scope of the invention as defined by the appended claims.

What is claimed is:

1. A ZIF PGA socket comprising a longitudinal base defining a recess exposed to an exterior thereof, a cover slidably engaging with the base, and an actuation device comprising a cam pivotably received in the recess of the base for actuating the cover to move laterally with respect to the base;

the cover having a first stop and a second stop projecting downward therefrom; and the cam having a first driving member and a second dying member upwardly projecting beyond a surface thereof to respectively form a first acting surface and a second acting surface and a handle portion extending into the exterior of the base and the cover, the first driving member and the second driving member being located on a same side of an axis defined in a lengthwise direction of the handle portion, the first and the second acting surfaces cooperating to selectively and respectively contact and drive either the first stop or the second stop to force the cover to move laterally with respect to the base when the handle is operated causing rotation of the cam with respect to the base, a rotational plane of the cam being substantially parallel to a plane of movement of the cover.

2. The ZIF PGA socket as claimed in claim 1, wherein the cam is sized to be rotatable in the recess of the base and limited within a predetermined range between opposite walls which bind the recess.

3. The ZIF PGA socket as claimed in claim 1, wherein the first driving member is a curved tab formed by stamping and moves along a contacting surface of the first stop to force the cover to move laterally with respect to the base when the cam is manually driven to rotate in a first orientation.

4. The ZIF PGA socket as claimed in claim 1, wherein the second driving member is a curved tab formed by stamping and moves along a contacting surface of the second stop to force the cover to move laterally with respect to the base when the cam is manually driven to rotate in a second orientation.

5. The ZIF PGA socket as claimed in claim 1, wherein the first driving member and the second driving member are curved tabs formed by stamping along opposite arcs of a virtual circle, the first driving member moving along a contacting surface of the first stop to force the cover to move laterally with respect to the base when the cam is manually driven to rotate in a first orientation, the second driving member moving along a contacting surface of the second stop to force the cover to move laterally with respect to the base when the cam is manually driven to rotate in a second orientation.

6. The ZIF PGA socket as claimed in claim 1, wherein the cover has at least one protrusion proximate the cam for limiting the rotation of the cam in a constant plane.

7. A ZIF PGA socket comprising a longitudinal base, a cover slidably engaging with the base, and an actuation device pivotably fixed to the base for actuating the cover to move laterally with respect to the base;

the base defining a first pivot member for pivotably engaging with the actuation device;

the cover having a first stop and a second stop forming a pair of parallel side walls opposite to and spaced from each other; and the actuation device having a cam and a handle portion extending from the cam, a second pivot member formed in the cam for pivotably engaging with the first pivot member, first driving means and second driving means upwardly projecting beyond a surface of the cam, the first driving means and the second driving means being located between the pair of parallel side walls and selectively and respectively in contact with the pair of parallel side walls to drive either the first stop or the second stop to force the cover to move laterally with respect to the base when the cam is operated to rotate about the first pivot member of the base.

8. The ZIF PGA socket as claimed in claim 7, wherein the first driving means is a circular protrusion and moves along a contacting surface of the first stop to force the cover to move laterally with respect to the base when the cam is manually driven to rotate in a first orientation.

9. The ZIF PGA socket as claimed in claim 7, wherein the second driving means is a circular protrusion and moves along a contacting surface of the second stop to force the cover to move laterally with respect to the base when the cam is manually driven to rotate in a second orientation.

10. The ZIF PGA socket as claimed in claim 7, wherein the first driving means and the second driving means are curved tabs formed by stamping along opposite arcs of a virtual circle, the first driving means moving along a contacting surface of the first stop to force the cover to move laterally with respect to the base when the cam is manually driven to rotate in a first orientation, the second driving means moving along a contacting surface of the second stop to force the cover to move laterally with respect to the base when the cam is manually driven to rotate in a second orientation.

11. The ZIF PGA socket as claimed in claim 7 further comprising a handle extending from the cam of the actuation device to an exterior of the socket.

12. A ZIF PGA socket comprising a longitudinal base defining a recess exposed to an exterior thereof, a cover slidably engaging with the base, and an actuation device comprising a cam pivotably received in the recess of the base for actuating the cover to move laterally with respect to the base;

the cover having a first stop and a second stop projecting downward therefrom; and the cam having a first driving member and a second driving member upwardly projecting beyond a surface thereof to respectively form a first acting surface and a second acting surface and a handle portion extending into the exterior of the base and the cover, the first acting surface and the second acting surface being located in opposite arc portions of a virtual circle and being simultaneously in contact with the first and the second stops and cooperating to selectively and respectively drive either the first stop or the second stop to force the cover to move laterally with respect to the base when the handle is operated causing rotation of the cam with respect to the base, a rotational plane of the cam being substantially parallel to a plane of movement of the cover.

13. The ZIF PGA socket as claimed in claim 12, wherein the first driving member and the second driving member are curved tabs.

14. The ZIF PGA socket as claimed in claim 13, wherein the cover has at least one protrusion proximate the cam for limiting the rotation of the cam in a constant plane.

15. Mechanism for moving a first member with regard to a second member linearly by rotation, comprising:

a first stop and a second stop formed on one of said first member and said second member;

an actuation device pivotably mounted to the other of said first member and said second member; and a first arc and an opposite second arc formed on said actuation device and being rotatably moved along with said other of said first member and said second member, and confronting and respectively engaged with the corresponding first stop and second stop; wherein said first stop forms a first planar contacting surface and said second stop forms a second planar contacting surface parallel to and opposite to said first planar contacting surface under the condition that both said first and second planar contacting surfaces are perpendicular to a direction of a linear relative movement between the first member and the second member; and said first arc and said second arc are configured so as to assure instant or constant engagement between the first arc and the first stop when said actuation device is rotated clockwise, and between the second arc and the second stop when said actuation device is rotated counterclockwise, while without any interference occurring therebetween.

16. The mechanism as claimed in claim 15, wherein said first arc and said second arc are generally concentric with each other.

17. The mechanism as claimed in claim 16, wherein the distance between the first stop and the second stop are generally equal to a sum of a first diameter of the first arc and a second diameter of the second arc so as to obtain constant engagement between the first arc and the first stop and between the second arc and the second stop to prevent free-wheeling of the actuation device of said other of said first member and said second member with regard to said one of said first member and said second member.

18. The mechanism as claimed in claim 17, wherein the first diameter of the first arc is equal to the second diameter of the second arc whereby said first arc and said second arc belong to a same circle.

* * * * *